(12) United States Patent
Kato et al.

(10) Patent No.: US 11,655,539 B2
(45) Date of Patent: May 23, 2023

(54) FILM DEPOSITION APPARATUS AND FILM DEPOSITION METHOD

(71) Applicant: Tokyo Electron Limited, Tokyo (JP)

(72) Inventors: Hitoshi Kato, Iwate (JP); Tomoya Hasegawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 16/520,955

(22) Filed: Jul. 24, 2019

(65) Prior Publication Data

US 2020/0040456 A1 Feb. 6, 2020

(30) Foreign Application Priority Data

Aug. 2, 2018 (JP) .............................. JP2018-146227

(51) Int. Cl.
| | | |
|---|---|---|
| *H01L 21/67* | (2006.01) | |
| *C23C 16/458* | (2006.01) | |
| *C23C 16/455* | (2006.01) | |
| *C23C 16/46* | (2006.01) | |
| *C23C 16/52* | (2006.01) | |
| *C23C 16/40* | (2006.01) | |

(52) U.S. Cl.
CPC .............. *C23C 16/46* (2013.01); *C23C 16/40* (2013.01); *C23C 16/4557* (2013.01); *C23C 16/4584* (2013.01); *C23C 16/52* (2013.01); *H01L 21/67248* (2013.01)

(58) Field of Classification Search
CPC ..... C23C 16/46; C23C 16/40; C23C 16/4584; C23C 16/52; C23C 16/4557; C23C 16/45563–45591; H01L 21/67248; H01L 21/68771; H01L 21/67155
USPC ......................................................... 118/730
See application file for complete search history.

(56) References Cited

U.S. PATENT DOCUMENTS

| | | | |
|---|---|---|---|
| 2001/0011653 A1* | 8/2001 | Shirakawa | ........ H01L 21/67248 219/390 |
| 2003/0075107 A1* | 4/2003 | Miyano | ............. C23C 16/45563 118/715 |
| 2003/0205202 A1* | 11/2003 | Funaki | .............. C23C 16/45565 118/723 E |
| 2008/0193643 A1* | 8/2008 | Dip | ................... C23C 16/45551 118/729 |
| 2009/0076763 A1* | 3/2009 | Okamura | .......... H01L 21/67248 374/45 |
| 2010/0055347 A1* | 3/2010 | Kato | ................. H01J 37/32449 118/715 |

(Continued)

FOREIGN PATENT DOCUMENTS

| | | |
|---|---|---|
| JP | 2009-224775 | 10/2009 |
| JP | 2010-239103 | 10/2010 |

(Continued)

*Primary Examiner* — Charlee J. C. Bennett

(74) *Attorney, Agent, or Firm* — IPUSA, PLLC

(57) ABSTRACT

A film deposition apparatus includes a process chamber, and a turntable disposed in the process chamber and configured to receive a substrate along a circumferential direction. At least one ozone gas supply part configured to supply ozone gas on the turntable is provided. A plate member is disposed to cover the ozone gas supply part. An ozone gas activator is disposed on or above an upper surface of the plate member and configured to activate the ozone gas.

13 Claims, 8 Drawing Sheets

(56) References Cited

U.S. PATENT DOCUMENTS

| | | | |
|---|---|---|---|
| 2014/0118751 A1* | 5/2014 | Rajagopalan | H01L 21/00 356/630 |
| 2014/0209028 A1* | 7/2014 | Oshimo | H01L 21/68771 118/730 |
| 2015/0361550 A1* | 12/2015 | Yabe | H01L 21/02164 438/782 |
| 2016/0244877 A1* | 8/2016 | Kato | C23C 16/45544 |
| 2019/0078210 A1* | 3/2019 | Gungor | C23C 16/505 |

FOREIGN PATENT DOCUMENTS

| | | |
|---|---|---|
| JP | 2013-225684 | 10/2013 |
| JP | 2014-017331 | 1/2014 |
| JP | 2014-022653 | 2/2014 |
| JP | 2016-004866 | 1/2016 |
| JP | 2016-136601 | 7/2016 |
| JP | 2016-157724 | 9/2016 |

* cited by examiner

FILM DEPOSITION APPARATUS AND FILM DEPOSITION METHOD

CROSS-REFERENCE TO RELATED APPLICATIONS

This patent application is based upon and claims priority to Japanese Patent Application No. 2018-146227, filed on Aug. 2, 2018, the entire contents of which are incorporated herein by reference.

BACKGROUND OF THE INVENTION

1. Field of the Invention

The disclosure relates to a film deposition apparatus and a film deposition method.

2. Description of the Related Art

Conventionally, as described in Japanese Patent Application Publication No. 2016-4866, a film deposition apparatus is known for obtaining an oxide film having preferable properties without using a heating mechanism for heating a substrate when depositing an oxide film on a substrate (See, e.g., Patent Document 1). In the film deposition apparatus described in Japanese Patent Application Publication No. 2016-4866, the apparatus is configured such that the table rotates relative to a first region and a second region so that the substrate is repeatedly positioned alternately between the first region and the second region; the source gas is supplied to the first region; and a processing space forming member is raised and lowered relative to the table in the second region. In the processing space formed by the processing space forming member, an atmospheric gas containing ozone, and NO gas are supplied, and NO and ozone chemically react with each other to supply energy to the ozone, and ozone is forcibly decomposed to oxidize the source gas by decomposing the ozone. In addition, a partition mechanism is provided to switch between a state of the processing space in communication with a buffer region to which the inert gas is supplied, and a state of the processing space partitioned from the buffer region, thereby inhibiting the pressure increase in the processing space during decomposition.

SUMMARY OF THE INVENTION

The present disclosure provides a film deposition apparatus and a film deposition method for improving oxidizing power by increasing decomposition efficiency of ozone without increasing a temperature of a wafer.

More specifically, embodiments of the present disclosure provide a film deposition apparatus that includes a process chamber, and a turntable disposed in the process chamber and configured to receive a substrate along a circumferential direction. At least one ozone gas supply part configured to supply ozone gas on the turntable is provided. A plate member is disposed to cover the ozone gas supply part. An ozone gas activator is disposed on or above an upper surface of the plate member and configured to activate the ozone gas.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments for carrying out the present disclosure are described below with reference to the accompanying drawings.

[Film Deposition Apparatus]

To begin with, a film deposition apparatus according to a first embodiment of the present disclosure will be described.

Figure 1:
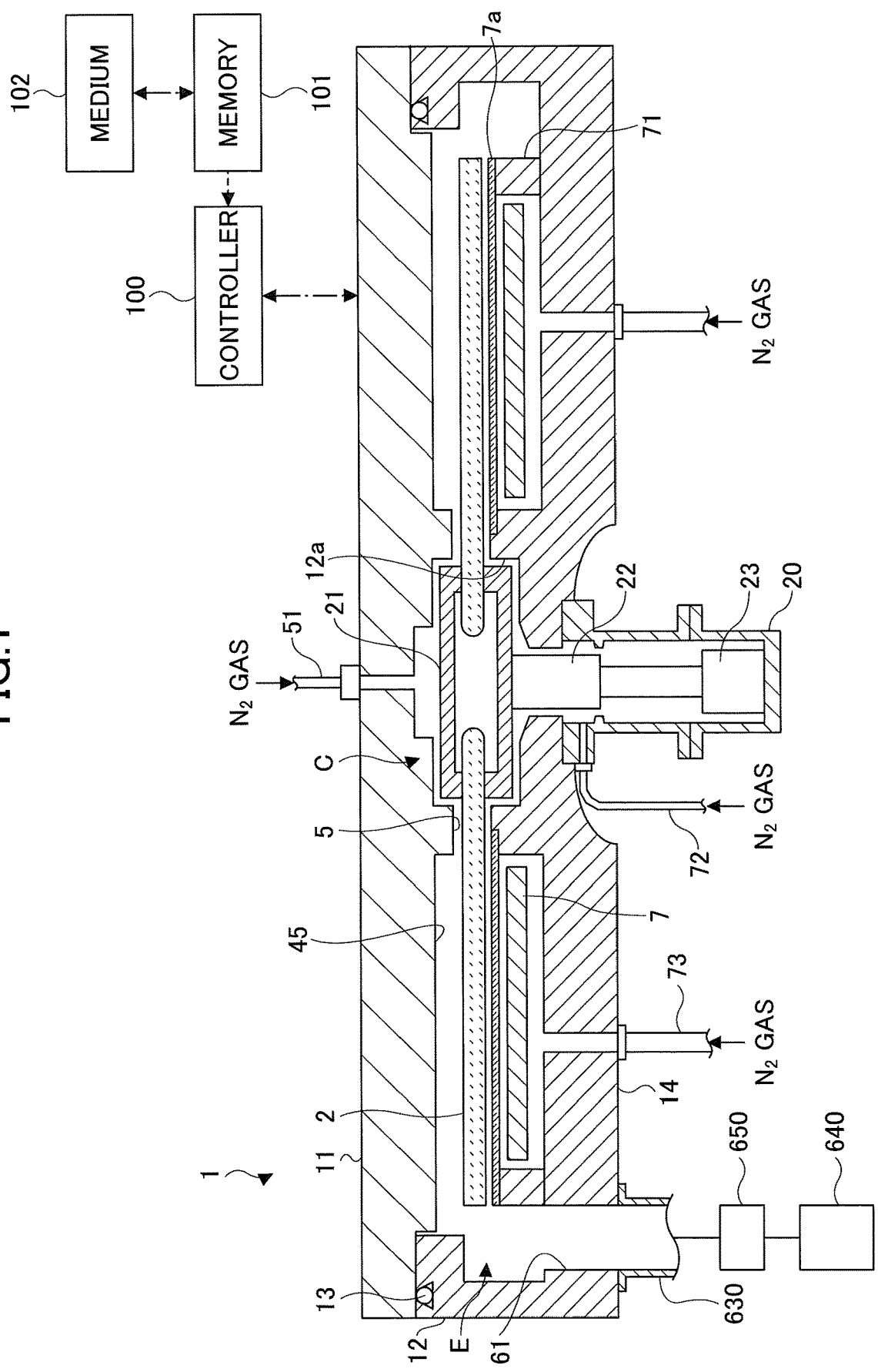
FIG. 1 is a cross-sectional view illustrating a film deposition apparatus according to an embodiment of the present disclosure.
Figure 2:
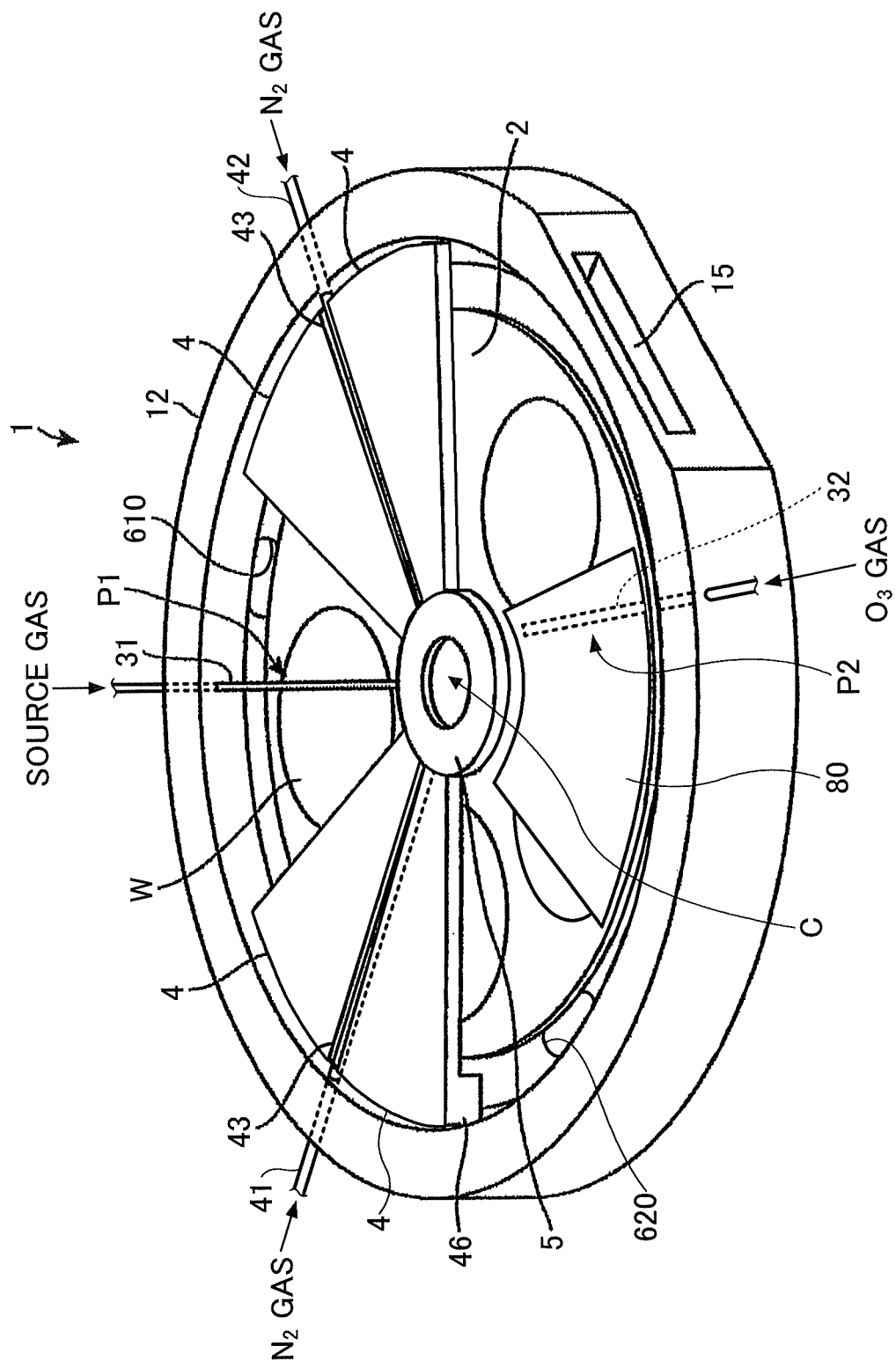
FIG. 2 is a perspective view illustrating a structure in a vacuum chamber of a film deposition apparatus according to an embodiment of the present disclosure.
Figure 3:
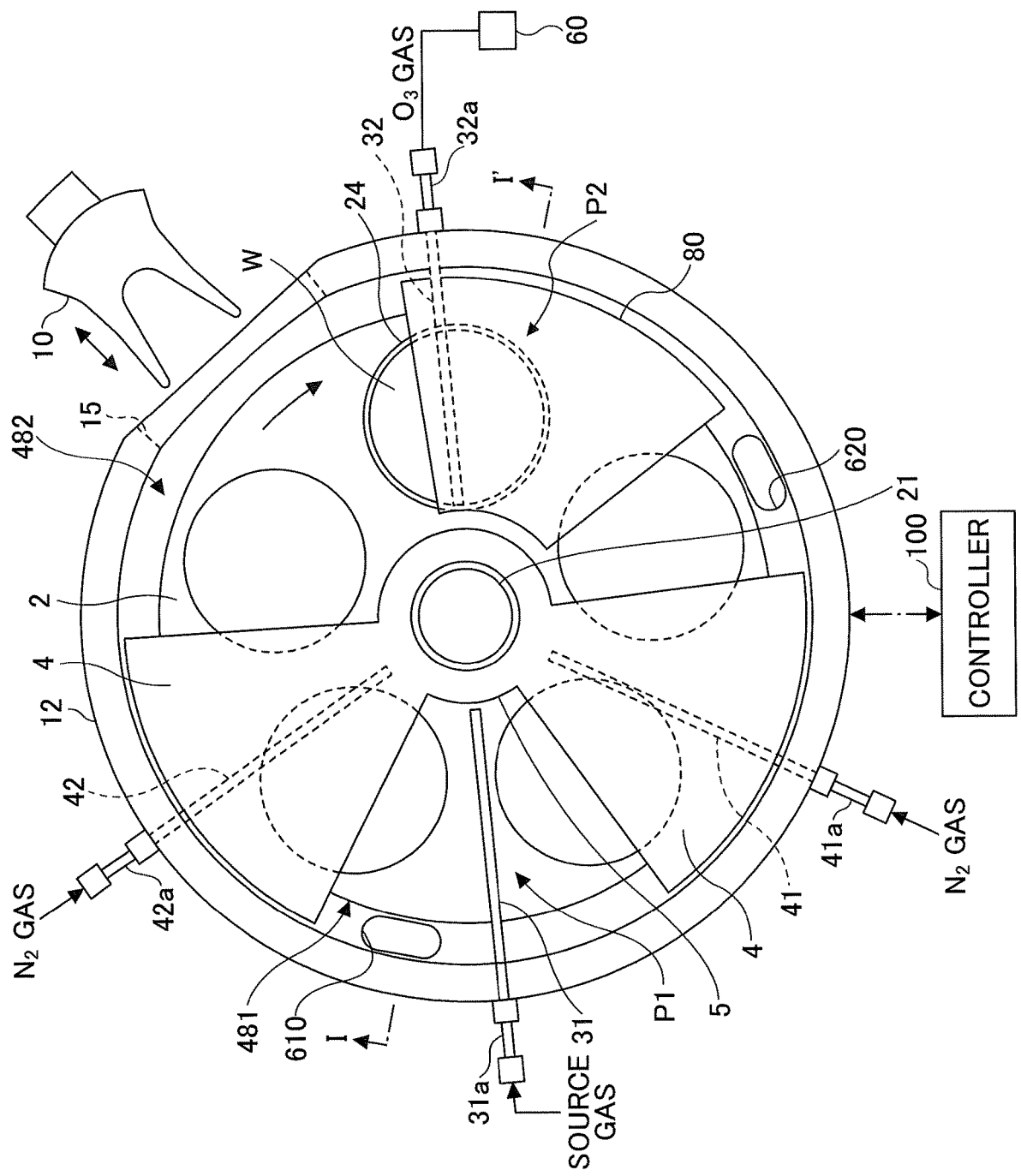
FIG. 3 is a schematic top view illustrating a structure of a vacuum chamber of a film deposition apparatus according to an embodiment of the present disclosure.

With reference to FIGS. 1 through 3, the film deposition apparatus includes a vacuum chamber 1 whose planar shape is an approximately round shape, and a turntable 2 provided in the vacuum chamber 1 and having a center of the rotation that coincides with the center of the vacuum chamber 1. The vacuum chamber 1 includes a chamber body 12 having a cylindrical shape with a bottom, and a ceiling plate 11 hermetically arranged on an upper surface of the chamber body 12 to be attachable to or detachable from the chamber body 12 through a seal member 13 (see FIG. 1) such as an O-ring.

The turntable 2 is fixed to a core portion 21 having a cylindrical shape at the center portion, and the core portion 21 is fixed to an upper end of a rotational shaft 22 that extends in a vertical direction. The rotational shaft 22 penetrates through a bottom part 14 of the vacuum chamber 1, and the lower end is attached to a drive part 23 that rotates the rotational shaft 22 (see FIG. 1) around the vertical axis. The rotational shaft 22 and the drive part 23 are housed in a cylindrical case body 20 whose upper surface is open. A flange part provided on the upper surface of this case body 20 is hermetically attached to the lower surface of a bottom part 14 of the vacuum chamber 1, by which the internal atmosphere of the case body 20 is separated from the external atmosphere.

As illustrated in FIGS. 2 and 3, a plurality of circular shaped concave portions 24 is provided to allow a plurality of (five in an example of FIG. 3) semiconductor wafers (which is hereinafter called "a wafer or wafers") to be disposed along a rotational direction (i.e., a circumferential direction) W. In FIG. 3, the wafer W is illustrated in a single concave portion 24 for convenience. This concave portion 24 has an inner diameter that is slightly greater, for example, 4 mm, than a diameter of the wafer W (e.g., 300 mm), and a depth approximately equal to a thickness of the wafer. Accordingly, when the wafer W is placed on the concave portion 24, the surface of the wafer W and the surface of the turntable 2 (which means an area where the wafer is not placed) have the same height.

FIGS. 2 and 3 are diagrams for illustrating a structure in the vacuum chamber 1, and the ceiling plate 11 is removed therefrom for convenience of explanation. As shown in FIGS. 2 and 3, a reaction gas nozzle 31, a reaction gas nozzle 32, and separation gas nozzles 41 and 42 that are respectively made of, for example, quartz, are arranged above the turntable 2. In the example shown in FIGS. 2 and 3, the separation gas nozzle 41, the reaction gas nozzle 31, the separation gas nozzle 42, and the reaction gas nozzle 32 are arranged in this order from a transfer opening 15 (which is described below) in a clockwise fashion (i.e., rotational direction of the turntable 2) at intervals in a rotational direction of the vacuum chamber 1. These nozzles 31, 32, 41 and 42 are introduced into the vacuum chamber 1 from an external wall by fixing gas introduction ports 31a, 32a, 41a and 42a that are base end portions of the respective nozzles 31, 32, 41 and 42 to the external wall of the chamber body 12 (see FIG. 3), and are installed to extend along the radial direction of the chamber body 12 and parallel to the turntable 2.

The reaction gas nozzle 31 is connected to a first reaction gas supply source storing a first reaction gas, through an on-off valve and a flow controller (both of which are not shown in the drawing). The reaction gas nozzle 32 is connected to a second reaction gas supply source reserving a second reaction gas that reacts with the first reaction gas, through an on-off valve and a flow controller (both of which are not shown in the drawing).

Here, the first reaction gas is selected from a gas containing a metal element (or semiconductor element). Specifically, a source gas for depositing a high-k (high dielectric material) film is selected as the first reaction gas, and the first reaction gas may be an organometal (or semiconductor) gas containing a metal element (or semiconductor element). Preferably, the first reaction gas is a gas that is adsorptive to the surface of the wafer W.

The second reaction gas is an oxidation gas that reacts with a first reaction gas adsorbed on the surface of the wafer W to produce an oxide, and specifically, an ozone gas is selected as the oxidation gas. Hence, the second reaction gas nozzle 32 is connected to an ozonizer 60 disposed outside the vacuum chamber 1. Ozone gas generated by the ozonizer 60 is supplied from the second reaction gas nozzle 32.

An activation plate 80 is disposed above the second reaction gas nozzle 32. The activation plate 80 is a plate-like member to accelerate the decomposition of ozone gas supplied from the second reaction gas nozzle 32 and to activate the ozone gas. Specifically, the activation plate 80 includes an ozone activating unit (not illustrated) to activate the ozone gas, and activates ozone gas supplied from the second reaction gas nozzle 32. The ozone activating units may employ a variety of means and members capable of activating ozone, such as photocatalysts, lasers, heaters and the like. Details of the ozone activating unit will be described later.

The activation plate 80 covers a wide area downstream of the second reaction gas nozzle 32 to activate ozone supplied from the second reaction gas nozzle 32. The activation plate 80 may have a generally fan-like shape, for example, as illustrated in FIGS. 2 and 3. Activation plate 80 may be, for example, made of quartz. Details of the activation plate 80 will be also described later.

Moreover, the separation gas nozzle 41 and 42 are connected to a source of an inert gas such as a noble gas including Ar or He or the like, or $N_2$ gas, via an on-off valve and a flow controller (both of which are not illustrated in the drawing). In the present embodiment, $N_2$ gas is used as the inert gas.

The reaction gas nozzles 31 and 32 include a plurality of gas discharge holes 33 that are open downward facing the turntable 2 (see FIG. 4) and are arranged along the length direction of the reaction gas nozzles 31 and 32 at intervals of, for example, 10 mm. A region under the reaction gas nozzle 31 is a first process region P1 to adsorb the first reaction gas on the wafer W. A region under the reaction gas nozzle 32 is a second process region P2 to oxidize the first reaction gas adsorbed on the wafer W in the first process region P1.

Figure 4:
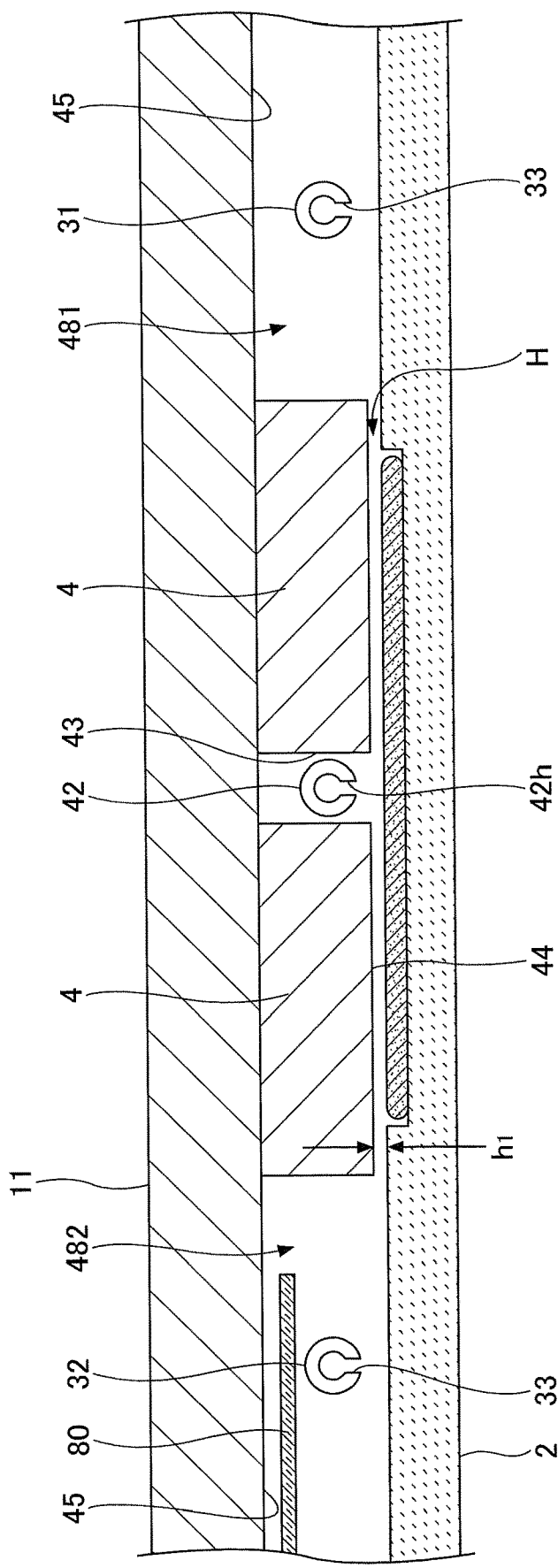
FIG. 4 is a partial cross-sectional view of a film deposition apparatus according to an embodiment of the present disclosure.

With reference to FIGS. 2 and 3, two convex portions 4 are provided in the vacuum chamber 1. The convex portions 4 have an approximately sectorial planar shape whose apex is cut in an arc-like form. In the present embodiment, the inner arc is coupled to a protrusion portion 5 (which is described below), and the outer arc is arranged so as to be along an inner periphery of the chamber body 12 of the vacuum chamber 1. FIG. 4 illustrates a cross section of the vacuum chamber 1 along a concentric circle of the turntable 2 from the first reaction nozzle 31 to the second reaction nozzle 32. As illustrated in FIG. 4, the convex portion 4 is attached to the back surface of the ceiling plate 11. Because of this, in the vacuum chamber 1, there are a low ceiling wall 44 (i.e., first ceiling wall) that is a lower surface of the convex portion 4, and a high ceiling wall 45 (i.e., second ceiling wall) higher than the ceiling wall 44 and located on both sides of the ceiling wall 44 in the circumferential direction.

In addition, as illustrated in FIG. 4, a groove 43 is formed in the convex portion 4 at the center in the circumferential direction, and the groove portion 43 extends along a radial direction of the turntable 2. The groove portion 43 houses the separation gas nozzle 42. The groove portion 43 is also formed in the other convex portion 4 in a similar way, and the separation gas nozzle 41 is housed therein. A plurality of gas discharge holes 42h is formed in the separation gas nozzle 42. The plurality of gas discharge holes 42h is formed along the length direction of the separation gas nozzle 42 at predetermined intervals (e.g., 10 mm). An opening size of the plurality of gas discharge holes 42h is, for example, 0.3 to 1.0 mm. Although an illustration is omitted, the plurality of gas discharge holes 42h is similarly formed in the separation gas nozzle 41.

The reaction gas nozzles 31 and 32 are respectively provided in areas under the high ceiling walls 45. These reaction gas nozzles 31 and 32 are provided in the vicinity of the wafer W away from the ceiling walls 45. For convenience of explanation, as illustrated in FIG. 4, the reaction gas nozzle 31 is provided in the space 481 below the high ceiling wall 45, and the reaction gas nozzle 32 is provided in the space 482 below the high ceiling wall 45.

An activation plate 80 is disposed above the reaction gas nozzle 32. The activation plate 80 is disposed to cover the reaction gas nozzle 32. The activation plate 80 is disposed in the vicinity of the reaction gas nozzle 32 so that the activation plate 80 can directly act on ozone gas to decompose and activate. Also, because the activation plate 80 can narrow the distance between the high ceiling wall 45 and the turntable 2, the space below the activation plate 80 can be made a high pressure that is higher than a pressure between the high ceiling wall 45 and the turntable 2 to facilitate contact between the ozone gas and the wafer W. In this regard, the activation plate 80 also has the function of improving the oxidizing power of the ozone gas.

The low ceiling wall 44 forms a separation space H of a narrow space relative to the turntable 2. When the separation gas nozzle 42 supplies $N_2$ gas, $N_2$ gas flows to the spaces 481 and 482 through the separation space H. On this occasion, because a volume of the separation space is smaller than those of the spaces 481 and 482, a pressure of the separation space H can be higher than that of the spaces 481 and 482 by $N_2$ gas. In other words, the separation space H provides a pressure barrier between the spaces 481 and 482. Furthermore, $N_2$ gas flowing from the separation space H to the spaces 481 and 482 works as a counter flow against the first reaction gas from the first process region P1 and the second reaction gas from the second process region P2. Accordingly, the first reaction gas from the first process region P1 and the second reaction gas from the second process region P2 are separated by the separation space H. Hence, a mixture and a reaction of the first reaction gas and the second reaction gas in the vacuum chamber 1 are reduced.

A height h1 of the ceiling wall 44 relative to the upper surface of the turntable 2 is preferably set at an appropriate height to make the pressure of the separate space H higher than the pressure of the spaces 481 and 482, considering the pressure in the vacuum chamber 1, a rotational speed of the turntable 2, and a supply amount of the separation gas (i.e., $N_2$ gas) to be supplied.

With reference to FIGS. 2 and 3 again, the protrusion portion 5 is provided so as to surround an outer circumference of the core portion 21 that fixes the turntable 2 on the lower surface of the ceiling plate 11. In the present embodiment, this protrusion portion 5 continuously extends to a region on the rotational center side of the convex portion 4, and the lower surface of the protrusion portion 5 is formed to be the same height as the ceiling wall 44.

Figure 5:
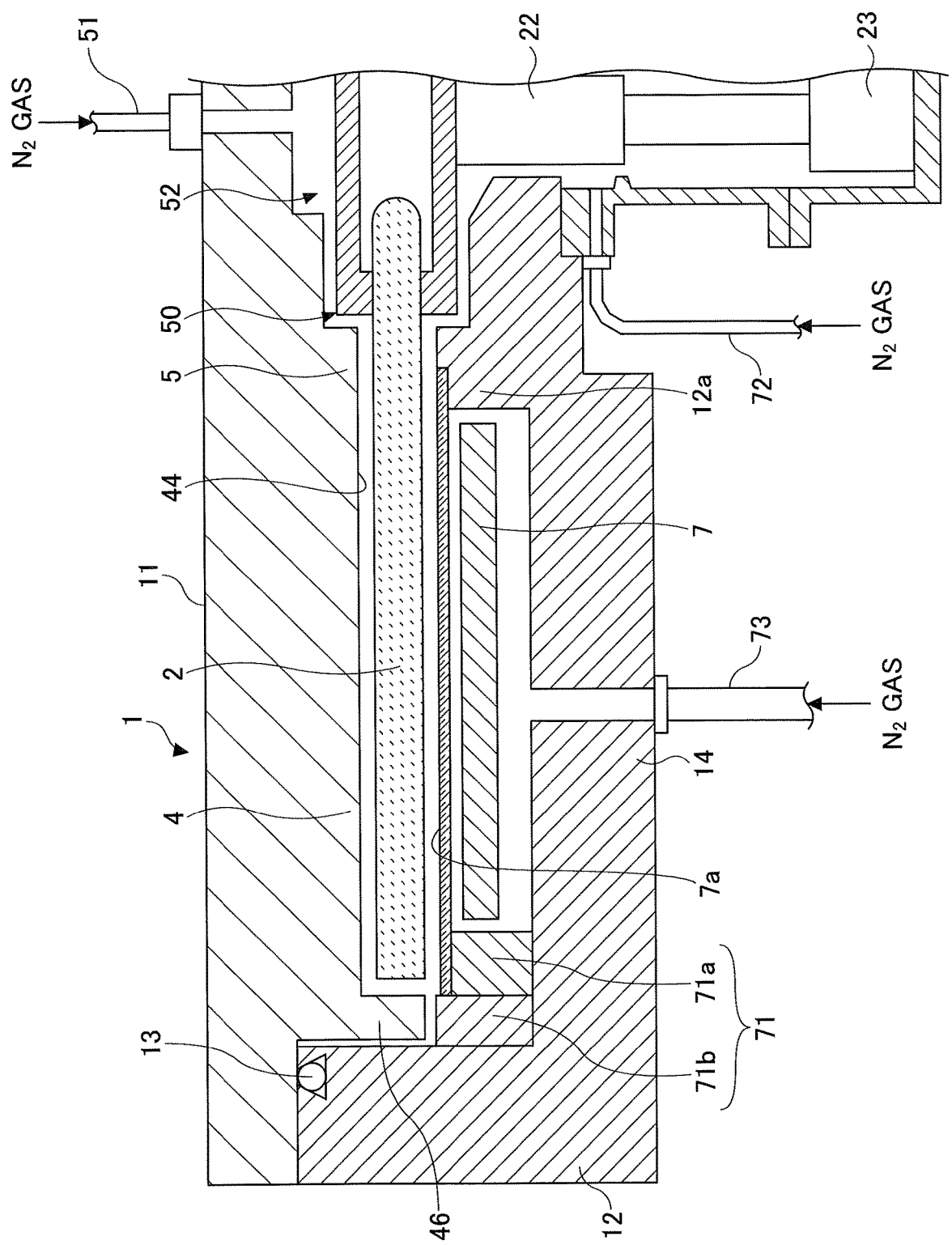
FIG. 5 is a partial cross-sectional view of another part of a film deposition apparatus according to an embodiment of the present disclosure.

Previously referred to FIG. 1 is a cross-sectional view along an I-I' line in FIG. 3, and shows an area where the ceiling wall 45 is provided. On the other hand, FIG. 5 is a partial cross-sectional view illustrating an area where the ceiling wall 44 is provided. As illustrated in FIG. 5, a bent portion 46 that is bent into an L-letter shape is formed in a periphery of the approximately sectorial convex portion 4 (i.e., a region on the outer edge of the vacuum chamber 1) so as to face the outer edge surface of the turntable 2. The bent portion 46 prevents a gas from circulating between the spaces 481 and 482 through a space between the turntable 2 and the inner periphery of the chamber body 12. Because the sectorial convex portion 4 is provided on the ceiling plate 11, and the ceiling plate 11 is detachable from the chamber body 12, there is a slight gap between the outer periphery of the bent portion 46 and the inner periphery of the chamber body 12. A gap between the inner periphery of the bent portion 46 and the outer edge surface of the turntable 2, and the gap between the outer periphery of the bent portion 46 and the inner periphery of the chamber body are, for example, set at a size similar to a height of the ceiling wall 44 relative to the upper surface of the turntable 2.

With reference to FIG. 3 again, a first evacuation opening 610 in communication with the space 481 and a second evacuation opening 620 in communication with the space 482 are formed between the turntable 2 and the inner periphery of the chamber body 12. As illustrated in FIG. 1, the first evacuation opening 610 and the second evacuation opening 620 are connected to, for example, vacuum pumps 640 of a evacuation unit through respective evacuation pipes 630. FIG. 1 also illustrates a pressure adjustor 650.

As illustrated in FIGS. 1 and 5, a heater unit 7 that is a heating unit is disposed in a space between the turntable 2 and the bottom part 14 of the vacuum chamber 1, and the wafer W on the turntable 2 is heated up to a temperature determined by a process recipe (e.g., 450 degrees) through the turntable 2. A ring-shaped cover member 71 is illustrated on the lower side of the periphery of the turntable 2 to prevent a gas from intruding into a space under the turntable 2. As illustrated in FIG. 5, the cover member 71 includes an inner member 71a disposed so as to face the outer edge portion of the turntable 2 and a further outer portion from the lower side, and an outer member 71b disposed between the inner member 71a and the inner wall surface of the vacuum chamber 1. The outer member 71b is disposed under the bent portion 46 formed in the outer edge portion of the convex portion 4 and close to the bent portion 46, and the inner member 71a is disposed to surround the heater unit 7 through the whole circumference under the outer edge portion of the turntable 2 (and the slightly further outer portion).

As illustrated in FIG. 1, the bottom part 14 in a region closer to the rotational center than the space where the heater unit 7 is arranged forms a protrusion part 12a so as to get closer to the core portion 21 in the center portion of the lower surface of the turntable 2. A gap between the protrusion part 12a and the core portion 21 forms a narrow space. Moreover, a gap between an inner periphery of a through-hole of the rotational shaft 22 that penetrates through the bottom part 14 and the rotational shaft 22 is narrow, and the narrow space is communication with the case body 20. The case body 20 includes a purge gas supply pipe 72 to supply $N_2$ gas as a purge gas to the narrow space fora purge. Furthermore, a plurality of purge gas supply pipes 73 is provided at predetermined angular intervals in the circumferential direction under the heater unit 7 to purge the arrangement space of the heater unit 7 (only a single purge gas supply pipe 73 is shown in FIG. 5). In addition, a lid member 7a that covers from the inner peripheral wall of the outer member 71b (i.e., the upper surface of the inner member 71a) to the upper end of the protrusion part 12a through the circumferential direction is provided between the heater unit 7 and the turntable 2 to prevent the gas from entering the area including the heater unit 7. The lid member 7a may be made of, for example, quartz.

When the purge gas supply pipe 72 supplies $N_2$ gas, this $N_2$ gas flows through the gap between the inner periphery of the through-hole and the rotational shaft 22, the gap between the protrusion part 12a and the core portion 21 and the space between the turntable 2 and the lid member 7a, and is evacuated from the first evacuation opening 610 or the second evacuation opening 620 (see FIG. 3). Moreover, when the purge gas supply pipe 72 supplies $N_2$ gas, $N_2$ gas flows out from the space including the heater unit 7 through a gap between the lid member 7a and the inner member 71a (not shown in the drawing), and is evacuated from the first evacuation opening 610 or the second evacuation opening 620 (see FIG. 3). The flows of $N_2$ gas can prevent the gases in the space 481 and 482 from being mixed through the space around the center and on the lower side of the vacuum chamber 1, and through the space under the turntable 2.

Furthermore, a separation gas supply pipe 51 is connected to the central part of the ceiling plate 11 of the vacuum chamber 1, and is configured to supply $N_2$ gas of the separation gas to a space 52 between the ceiling plate 11 and the core portion 21. The separation gas supplied to the space 52 is discharged toward the outer edge through a narrow space 50 between the protrusion portion 5 and the turntable 2, and along the surface of the turntable 2 on the wafer receiving area side. The space 50 can be maintained at a higher pressure than that of the spaces 481 and 482 by the separation gas. Accordingly, the space 50 serves to prevent the first reaction gas supplied to the first process region P1 and the second reaction gas supplied to the second process region P2 from being mixed through the center area C. In other words, the space 50 (or the center area C) can function as well as the separation space H (or the separation area D).

In addition, as illustrated in FIGS. 2 and 3, the transfer opening 15 is formed in the side wall of the vacuum chamber 1 to transfer the wafer W, which is the substrates, between the outer transfer arm 10 and the turntable 2. The transfer opening 15 is configured to be hermetically openable and closeable by a gate valve not shown in FIGS. 2 and 3. Moreover, the wafer W is transferred between the concave portions 24, which are the wafer receiving areas in the turntable 2, and the transfer arm 10 at a position where one of the concave portions 24 faces the transfer opening 15. Accordingly, lift pins for transfer to lift up the wafer W from the back side by penetrating through the concave portion 24 and the lifting mechanism (none of which are shown in the drawing) are provided at the position corresponding to the transfer position under the turntable 2.

Moreover, as shown in FIG. 1, a control part 100 constituted of a computer to control operations of the whole apparatus is provided in this film deposition apparatus, and a program to implement a film deposition process described below is stored in a memory of the control part 100. This program is constituted of instructions of step groups to cause the apparatus to implement respective operations of the apparatus, and is installed from a memory part 101 of a recording medium 102 such as a hard disk, a compact disc, a magnetic optical disc, a memory card and a flexible disc into the control part 100.

Next, the case of using the activation plate 80 and the ozone activating unit as a heater will be described.

Figure 6:
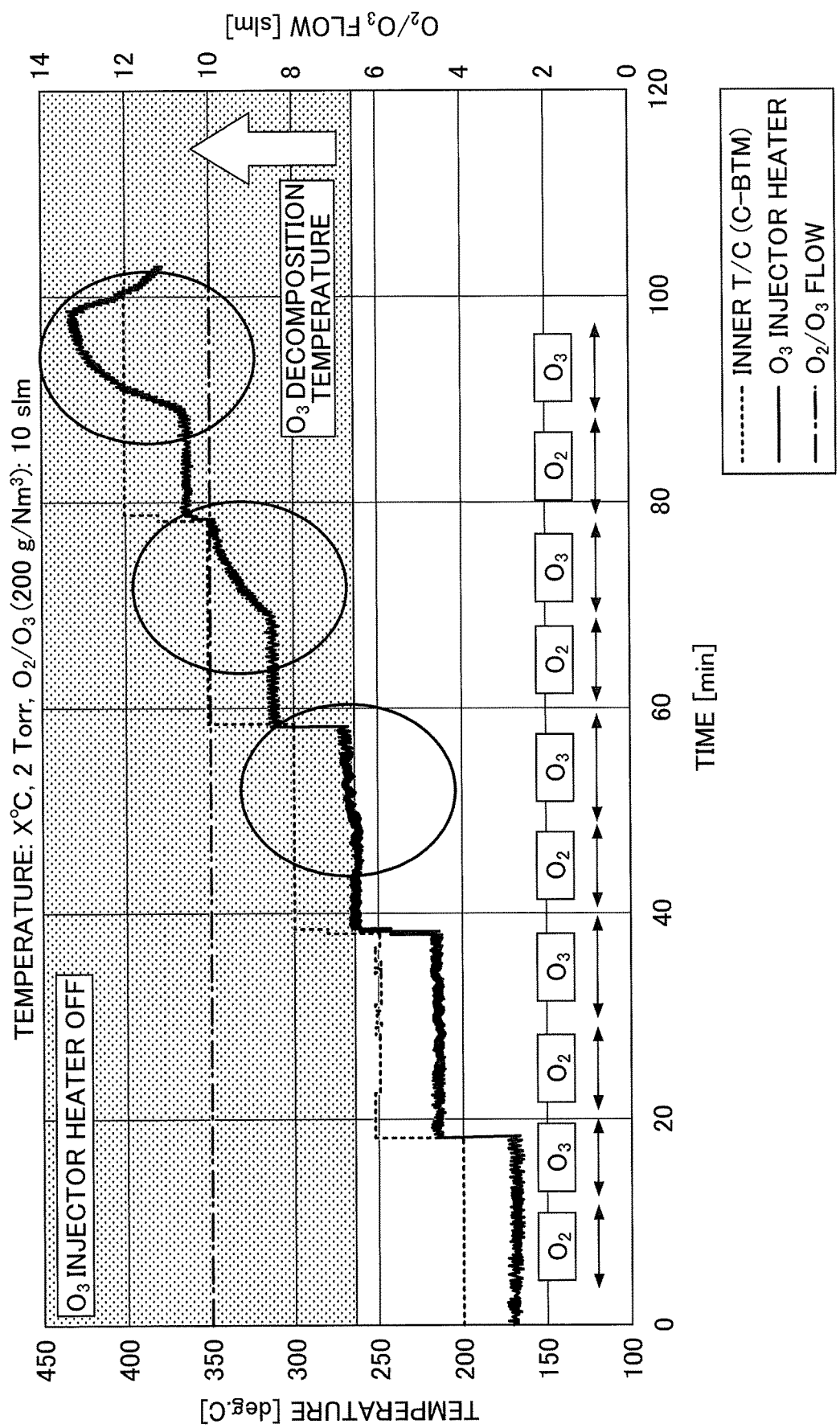
FIG. 6 is a graph showing a result of an experiment to examine a temperature at which ozone decomposes in a vacuum chamber of a film deposition apparatus according to an embodiment of the present disclosure.

FIG. 6 is a graph showing the results of an experiment of what temperature in the vacuum chamber 1 ozone decomposes at in the film deposition apparatus described in FIGS. 1 through 5.

Ozone is thermally decomposed as shown by the following formula (1).

$$2O_3 \rightarrow 3O_2 + 286 \text{ kJ} \qquad (1)$$

As shown in the formula (1), decomposition of ozone to oxygen causes an exothermic reaction of 286 kJ, which generates strong energy and enhances ozone oxidation. Therefore, decomposition of ozone can generate a strong oxidation force.

Therefore, from the viewpoint of oxidation, it is preferable to set a temperature such that ozone is thermally decomposed. However, in the case of depositing a high-k (high-dielectric) film using organometallic gas as a source gas, the temperature of the heater unit 7 is often set at around 300° C. as a deposition condition. If the set temperature of the heater unit 7 is around 300° C., ozone gas supplied from the second reaction gas nozzle 32 may not necessarily be thermally decomposed.

Accordingly, an experiment was conducted on how many times ozone gas decomposes in the vacuum chamber 1. FIG. 6 shows these results.

In FIG. 6, when the temperature in the vacuum chamber 1 was 250° C. or higher and lower than 300° C. (for a period of about 50-60 seconds), only a few decomposition reactions occurred. However, many decomposition reactions occurred at 300° C. or higher (for a period of about 70-80 seconds), and thermal decomposition of ozone occurred at 350° C. or higher (for a period of about 90-100 seconds).

Ozone decomposes at 275° C. or higher, increasing its oxidation capacity. Even if the heater unit 7 in the turntable 2 is set to 300° C., it is heated through the turntable 2 of quartz. Therefore, the inside of the vacuum chamber 1 may not necessarily be higher than 275° C. However, if ozone is directly heated at the point where ozone is supplied, the condition that ozone is heated to 275° C. or higher can be reliably satisfied.

Also, although the temperature setting of the wafer W has a limitation caused by the process, ozone gas has no such a limitation. Accordingly, in the present embodiment, a heater separate from the heater unit 7 is provided in the activation plate 80, and a configuration capable of controlling the temperature independently of the heater unit 7 is adopted.

Figure 7:
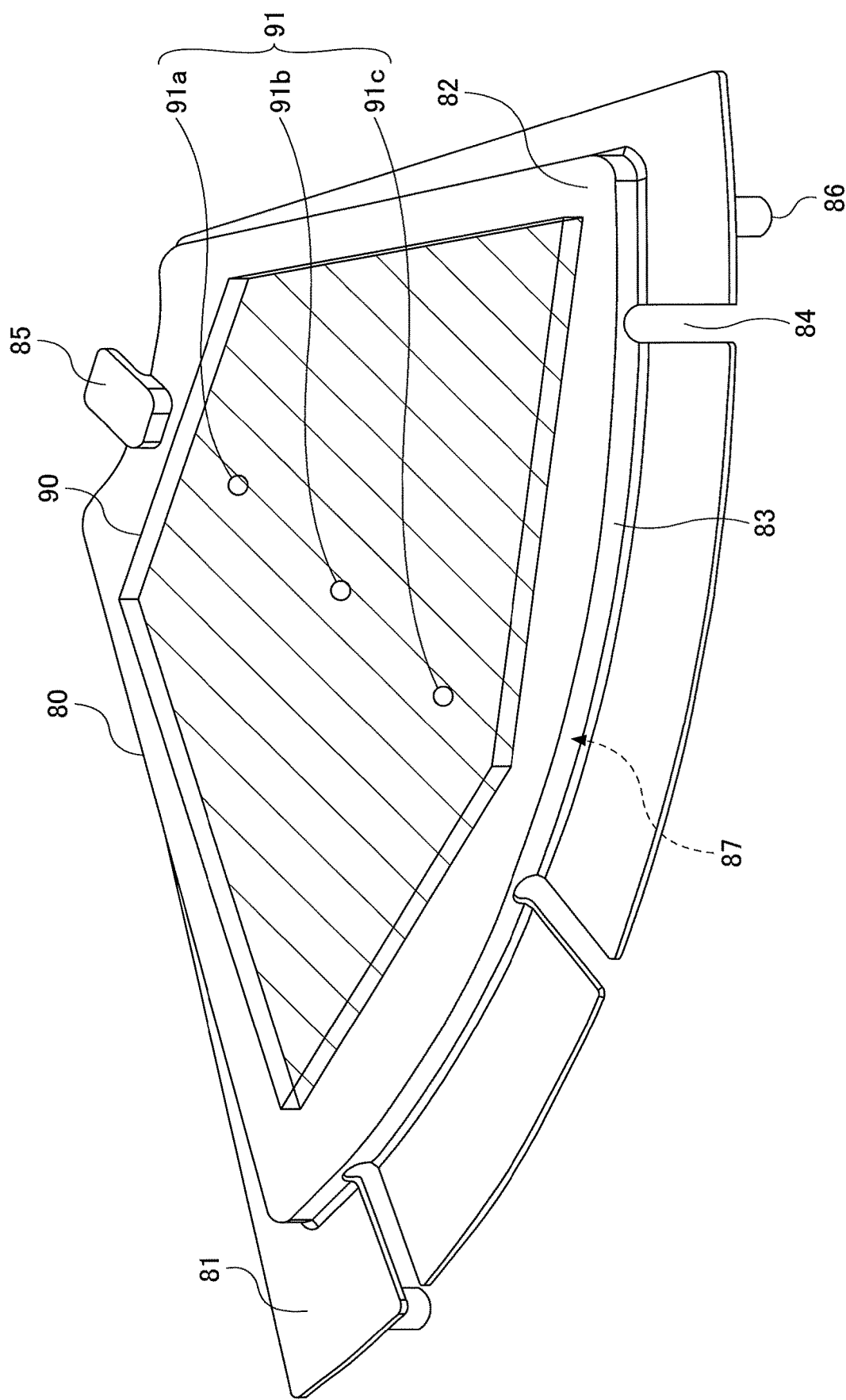
FIG. 7 is a diagram illustrating an example of an activation plate and a heater of a film deposition apparatus according to an embodiment of the present disclosure.

FIG. 7 is a diagram illustrating an example of an activation plate 80 and a heater 90 of a film deposition apparatus according to the present embodiment. In FIG. 7, a perspective view of the top surface of activation plate 80 is illustrated and is provided so as to substantially cover the entire top surface of activation plate 80 with the heater 90.

As illustrated in FIG. 7, the activation plate 80 includes a bottom plate 81, a top plate 82, a side plate 83, a cutout portion 84, an upper fixing portion 85, and a lower fixing portion 86.

The bottom plate 81 forms a bottom surface of the activation plate 80, and is a portion facing the turntable 2. The top plate 82 forms a top surface of the activation plate 80, and forms a mounting surface or a receiving surface for receiving the heater 90 thereon. The heater 90 is disposed on or above the top plate 82. The side plate 83 is a portion connecting the step between the bottom plate 81 and the top plate 82, and is provided to intersect both the bottom plate 81 and the top plate 82, for example, perpendicular to the bottom plate 81 and the top plate 82. The step is formed by providing the bottom plate 81 and the top plate 82 in order to ensure a space for storing the reaction gas nozzle 32. The space formed by the top plate 82 and the side plate 83 that accommodate the reaction gas nozzle 32 is referred to as an accommodating portion 87. As illustrated in FIG. 7, the accommodating portion 87 has a wide area and is configured to be able to accommodate a plurality of reaction gas nozzles 32.

The cutout portion 84 is a through hole provided to let the reaction gas nozzle 32 pass through. In FIG. 7, an activation plate 80 having three cutout portions 84 is illustrated. In this manner, if the oxidizing power is to be enhanced, a configuration may include a plurality of reaction gas nozzles 32 in the activation plate 80. In FIG. 7, although a configuration in which three reaction gas nozzles 32 are provided is illustrated, the number of reaction gas nozzles 32 can be appropriately changed depending on the intended use. In addition, as illustrated in FIGS. 2 and 3, only a single reaction gas nozzle 32 may be provided.

The top fixing portion 85 is a portion for fixing the top plate 82 of the activation plate 80 to the ceiling wall 45 and also serves as a spacer for securing a space to place the heater 90 on or above the top plate 82. The lower fixing portion 86 is a portion for fixing the bottom plate 81 of the activation plate 80.

The heater 90 is a heating unit for heating and activating ozone gas present inside the reaction gas nozzle 32 and outside the reaction gas nozzle 32. By disposing the heater 90 near the reaction gas nozzle 32, that is, directly above the reaction gas nozzle 32, it is intended to efficiently heat only ozone gas without affecting the temperature near the wafer W. By providing such a heater 90, ozone gas can be heated from directly above, and can be decomposed at the time of supplying ozone gas, and ozone gas can be supplied in an activated state, thereby improving the oxidizing power of the ozone.

The heater 90 may optionally include a temperature detector 91 therein. By providing a temperature detector 91, the temperature in the activation plate 80 can be detected in real time, and the temperature of the heater 90 can be set at a temperature at which ozone gas reliably decomposes.

In this manner, feedback control may be employed to control the temperature of the heater 90 such that the ozone gas is reliably decomposed. For example, the controller 100 performs the control. The target temperature of the heater 90 is set in advance to a temperature such that the ozone gas supplied from the reaction gas nozzle 32 is reliably decomposed, and the controller 100 acquires the detection temperature from the temperature detector 91, and then controls the temperature of the heater 90 so that the temperature gets close to the target temperature, thereby ensuring that ozone gas decomposes and improves the oxidizing power.

The temperature detector 91 may include a plurality of temperature detectors 91a to 91c at different locations along the radial direction of the turntable 2, such as a temperature detector 91a located at the radial center of the rotating table 2, a temperature detector 91b located at the outer circumferential side, and a temperature detector 91c located in the middle of the temperature detectors 91a and 91b in the radial direction. Thus, feedback control can be performed with respect to each of the plurality of radial positions, and more accurate temperature control can be achieved. FIG. 7 cites an example of providing three temperature detectors 91a to 91c, but the number and arrangement of the temperature detectors 91a to 91c may be varied depending on the intended use.

The temperature detector 91 may also include a variety of temperature detectors 91, as long as the temperature in the activation plate 80 can be properly detected, and for example, a thermocouple may be used as the temperature detector 91.

The temperature detector 91 does not necessarily need to be disposed within the activation plate 80, and may be provided on the surface of the activation plate 80 or in a space near the activation plate 80. The temperature detector 91 may be installed in various locations depending on the temperature controlled target.

At this time, the controller 100 can independently control the temperature of the heater unit 7 provided in the turntable 2, and can independently control the heater unit 7 and the heater 90.

As described above, according to the film deposition apparatus of the first embodiment, the oxidizing power of ozone can be significantly improved by providing the activation plate 80 and providing the heater 90 on its upper surface to heat and decompose ozone gas while forming a high pressure region below the activation plate 80. Furthermore, by providing the temperature detector 91 in or near the activation plate 80, the temperature can be properly controlled under various conditions, thereby reliably enhancing the oxidizing power of ozone.

Figure 8:
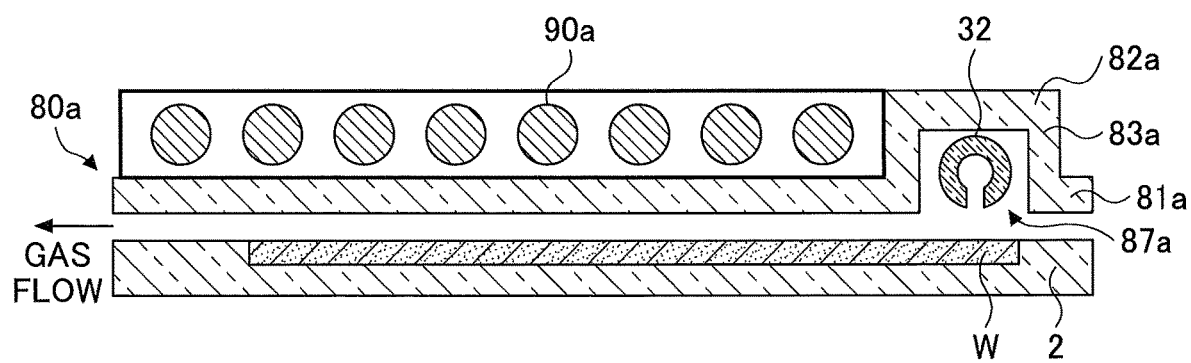
FIG. 8 is a diagram illustrating an example of a film deposition apparatus according to a second embodiment of the present disclosure.

FIG. 8 is a diagram illustrating an example of a film deposition apparatus according to a second embodiment. The film deposition apparatus according to the second embodiment differs from the film deposition apparatus according to the first embodiment in that a region surrounded by a bottom plate 81a, a top plate 82a, and a side plate 83a of an activation plate 80a has a size equal to a size of a single second reaction gas nozzle 32. In this way, an accommodating portion 87a to accommodate a single reaction gas nozzle 32 may be formed at a position on the upstream side in the activation plate 80a in the rotation direction of the turntable 2.

The heater 90a is provided to substantially cover the entire surface on the downstream side of the accommodating portion 87a for the reaction gas nozzle 32. The heater 90a is slightly smaller in width than the heater 90, but the configuration is the similar to the heater 90.

Thus, by reducing the size of the accommodating portion 87a for the reaction gas nozzle 32 and increasing the area of the bottom plate 81a, a high pressure region under the activation plate 80a may be widely ensured. By doing this, the high pressure regions can be widely formed.

If desired, the temperature detector 91 may be provided in the activation plate 80a or near the activation plate 80a, as well as the film deposition apparatus according to the first embodiment, to perform feedback control by the controller 100. The details are the same as those described in the first embodiment.

Because the other components are the same as those of the film deposition apparatus according to the first embodiment, the description thereof is omitted.

Figure 9:
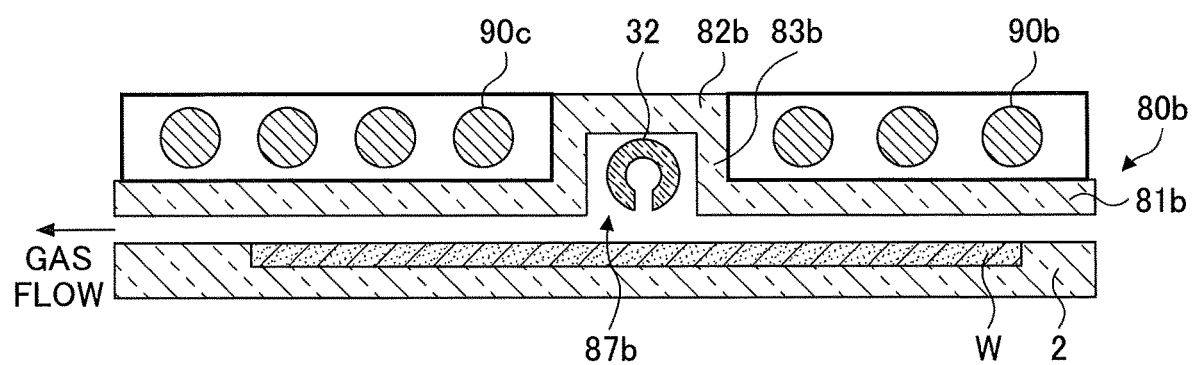
FIG. 9 is a diagram illustrating an example of a film deposition apparatus according to a third embodiment of the present disclosure.

FIG. 9 is a diagram illustrating an example of a film deposition apparatus according to a third embodiment. In the film deposition apparatus according to the third embodiment, a region surrounded by a bottom surface plate 81b, a top plate 82b, and a side plate 83b of the activation plate 80a is the same size as the film deposition apparatus according to the second embodiment. However, the film deposition apparatus according to the third embodiment differs from the film deposition apparatus according to the second embodiment in that the accommodating portion 87b is provided in the substantially central portion of an activation plate 80b. Accordingly, a heater 90b is provided on the upstream side of the accommodating portion 87b, and a heater 90c is provided on the downstream side, respectively, and heaters 90b and 90c are provided by being divided into two pieces. In this manner, the reaction gas nozzle 32 maybe disposed at the center of the activation plate 80b and heaters 90b and 90c may be disposed on both sides of the turntable 2 in the rotational direction.

The heater 90b is provided to substantially cover the entire upstream side of the accommodating portion 87b of the reaction gas nozzle 32, and the heater 90c is provided to substantially cover the entire downstream side of the accommodating portion 87b of the reaction gas nozzle 32. The two heaters 90b and 90c are configured to substantially cover the entire surface of the activation plate 80b.

Thus, the accommodating portion 87b of the reaction gas nozzle 32 may be disposed near the center of the activation plate 80b and the heaters 90b and 90c may be disposed on both sides.

If desired, a temperature detector 91 may be provided in the activation plate 80a or near the activation plate 80a, similar to the film deposition apparatus according to the first embodiment, to perform feedback control by the controller 100. The details of the configuration are the same as those described in the first embodiment.

Because the other components are similar to the film deposition apparatus according to the first and second embodiments, the description thereof is omitted.

[Film Deposition Method]

Next, a film deposition method according to an embodiment of the present disclosure is described below while taking a case of being implemented using the above-mentioned film deposition apparatus. An example of using the film deposition apparatus according to the first embodiment and including only a single reaction nozzle 32 is described below.

To begin with, the gate valve G is opened, and a wafer W is transferred onto the concave portion 24 of the turntable 2 through the transfer opening 15 by the transfer arm 10. This transfer is performed by allowing the lift pins not illustrated in the drawings to move up and down from the bottom side of the vacuum chamber 1 through the through holes of the bottom surface of the concave portion 24 when the concave portion 24 is stopped at a position opposite to the transfer opening 15. Such a transfer of the wafers W is performed, while rotating the turntable 2 intermittently, and the wafers W are placed in the five concave portions 24 of the turntable 2.

Next, the gate valve G is closed, and the vacuum chamber 1 is evacuated by the vacuum pump 640 up to a minimum degree of vacuum. After that, the separation gas nozzles 41 and 42 supply $N_2$ gas of the separation gas at a predetermined flow rate, and the separation gas supply pipe 51 and the purge gas supply pipe 72 and 73 also supply $N_2$ gas of the separation gas at a predetermined flow rate. In response to this, the pressure adjustor 650 adjusts the pressure in the vacuum chamber 1 to be a preliminarily set process pressure. Next, the wafer W is heated, for example, to become a temperature in a range from 250° C. to 650° C. by the heater unit 7, while rotating the turntable 2 in a clockwise fashion at a rotational speed of, for example, at most 240 rpm.

Subsequently, the first reaction gas nozzle 31 supplies a first reaction gas, and the second reaction gas nozzle 32 supplies ozone gas. In other words, the first reaction gas and ozone gas are supplied at the same time. However, these gases are separated by the separation space H (see FIG. 4), and hardly mix with each other. The source gas may be, for example, an organometallic gas that is used to deposit a high-k film.

When the source gas and ozone gas are simultaneously supplied, the source gas is adsorbed on a surface of the wafer W while the wafer W passes through the first process region P1 by the rotation of the turntable 2, and the source gas adsorbed on the surface of the wafer W is oxidized to deposit a thin film of a reaction product, which is the oxide of the source gas, on the surface of the wafer W while the wafer W passes through the second process region P2.

At this time, the ozone gas is heated by the heater 90 of the activation plate 80, and thermal oxidation occurs to oxidize the source gas with increased oxidizing power. Accordingly, the source gas is oxidized by very high oxidizing power, and a high quality film can be deposited.

By repeating the rotation of the turntable 2, the wafer W on the turntable 2 repeats a cycle of passing through the first process region P1, the separation region D, the second process region P2, and the separation region D. In the separation region D, a purge gas, such as $N_2$ gas, is supplied and the surface of the wafer W is purged.

That is, the rotation of the turntable 2 repeats a cycle of adsorption, purge, ozone oxidation, and purge of the source gas on the wafer W. In oxidizing using ozone, a molecular layer of the oxide film is deposited on the surface of the wafer W, and the oxide film is gradually deposited.

During such a deposition process, as necessary, the controller 100 may control the temperature of the heater 90 in response to the temperature detected by the temperature detector 91 and provide feedback control such that the activation plate 80 has a temperature suitable for decomposing and activating ozone gas. On this occasion, if the temperature detectors 91 are located in a plurality of locations, local temperature control may be performed.

After such a deposition process is continued and a film is deposited to a predetermined film thickness, the gas supply to vacuum chamber 1 is stopped; the rotation of turntable 2 is stopped, and the wafer W is carried out of the vacuum chamber 1 according to a reversed order of carrying the wafer W into vacuum vessel 1. This completes the film deposition process.

As described above, according to the film deposition method of the present embodiment, it is possible to improve the quality of the thin film by thermally decomposing ozone gas and improving the oxidizing power without increasing the temperature of the wafer W.

As described above, according to embodiments of the present disclosure, oxidation power can be improved by improving decomposition efficiency of ozone.

Although the preferred embodiments of the invention have been described in detail, the invention is not limited to the embodiments described above, and various modifications and substitutions can be made to the embodiments described above without departing from the scope of the invention.

What is claimed is:

1. A film deposition apparatus comprising:
   a process chamber including a ceiling plate;
   a turntable disposed in the process chamber and configured to receive a substrate along a circumferential direction;
   at least one ozone gas supply nozzle configured to supply ozone gas on the turntable;
   a plate member disposed to cover the ozone gas supply nozzle; and
   an ozone gas activator disposed on or directly above an upper surface of the plate member and configured to activate the ozone gas, wherein only the at least one ozone gas supply nozzle has a gas discharge hole, and the plate member and the ozone gas activator are formed separately from the ozone gas supply nozzle,
   wherein the ozone gas activator is disposed between the plate member and the ceiling plate of the process chamber,
   wherein the ozone gas activator and the at least one ozone gas supply nozzle extend in a radial direction of the turntable, and
   wherein the ozone gas activator overlaps the at least one ozone gas supply nozzle in a direction perpendicular to the turntable,
   wherein the at least one ozone gas supply nozzle includes only one nozzle, and the plate member includes an accommodating portion that accommodates the only one nozzle, and wherein the ozone gas activator is arranged at a downstream side in a rotation direction of the turntable relative to the only one nozzle.

2. The film deposition apparatus as claimed in claim 1, wherein the ozone activator is a first heater configured to heat the ozone gas; and further comprising:
   a second heater disposed below the turntable and configured to heat the substrate; and
   a controller configured to control a first temperature of the first heater and a second temperature of the second heater independently of each other.

3. The film deposition apparatus as claimed in claim 2, wherein the controller is configured to control the first temperature of the first heater to a temperature that is higher than the second temperature of the second heater.

4. The film deposition apparatus as claimed in claim 3, wherein the controller is configured to control the first temperature of the first heater to a temperature that is higher than a decomposition temperature of the ozone.

5. The film deposition apparatus as claimed in claim 2, wherein the plate member is horizontally disposed in a space between the ceiling plate the process chamber and the turntable such that a pressure between the plate member and the turntable is higher than a pressure between the ceiling plate and the turntable.

6. The film deposition apparatus as claimed in claim 2, wherein the first heater is disposed to substantially cover an entire surface of the plate member.

7. The film deposition apparatus as claimed in claim 2, wherein the plate member is made of quartz.

8. The film deposition apparatus as claimed in claim 2, wherein the plate member has a fan-like shape having an arc shape along an outer circumference of the turntable.

9. The film deposition apparatus as claimed in claim 2, wherein the ozone gas supply nozzle is disposed on an upstream side in the plate member in a rotational direction of the turntable, and
   wherein the first heater is disposed on the downstream side above the ozone gas supply nozzle in the rotational direction of the turntable.

10. The film deposition apparatus as claimed in claim 2, further comprising:
    at least one thermocouple disposed in the plate member, and
    wherein the controller is configured to control the first temperature of the first heater based on a temperature detected by the thermocouple.

11. The film deposition apparatus as claimed in claim 10, wherein the at least one thermocouple includes a plurality of thermocouple arranged in the rotational direction of the turntable.

12. The film deposition apparatus as claimed in claim 1, further comprising:
    a source gas supply nozzle disposed upstream of the ozone gas supply nozzle in the rotational direction of the turntable and configured to supply a source gas to the turntable;
    a first separation gas nozzle disposed downstream of the source gas supply nozzle and upstream of the ozone gas supply nozzle in the rotational direction of the turntable and configured to supply a first separation gas to the turntable; and
    a second separation gas nozzle disposed downstream of the ozone gas supply nozzle and upstream of the source gas supply nozzle in the rotational direction of the turntable and configured to supply a second separation gas to the turntable.

13. The film deposition apparatus as claimed in claim 12, wherein the source gas supply nozzle is configured to supply a source gas used for depositing a high-k film.

* * * * *